United States Patent [19]

Brown

[11] 4,204,153
[45] May 20, 1980

[54] METHOD OF DETERMINING THE OPEN CIRCUIT VOLTAGE OF A BATTERY IN A CLOSED CIRCUIT

[75] Inventor: William E. Brown, Walnut Creek, Calif.

[73] Assignee: The Dow Chemical Company, Midland, Mich.

[21] Appl. No.: 939,157

[22] Filed: Sep. 1, 1978

[51] Int. Cl.² ............................................. G01N 27/42
[52] U.S. Cl. ...................................... 324/429; 320/48
[58] Field of Search .......................... 320/48; 324/29.5

[56] References Cited

U.S. PATENT DOCUMENTS

| 2,922,104 | 1/1960 | Godshalk | 324/29.5 |
| 4,044,304 | 8/1977 | Hamaguchi | 324/29.5 |

Primary Examiner—M. Tokar
Attorney, Agent, or Firm—Ronald G. Brookens

[57] ABSTRACT

The open circuit voltage of a battery which is connected in a closed circuit is determined without breaking the circuit or causing voltage upsets therein. The closed circuit voltage across the battery and the current flowing through it are determined under normal load and then a fractional change is made in the load and the new current and voltage values determined. The open circuit voltage is then calculated, according to known principles, from the two sets of values.

3 Claims, 1 Drawing Figure

METHOD OF DETERMINING THE OPEN CIRCUIT VOLTAGE OF A BATTERY IN A CLOSED CIRCUIT

BACKGROUND OF THE INVENTION

The present invention was made in the course of a United States Government Research Contract, D.O.E. EY-76-C-02-2565.

There are numerous applications of batteries in which the internal resistance and/or open circuit voltage of a battery is of interest. This is particularly so in developing new types of high performance, rechargeable batteris (or cells). Typical battery development programs require lifetime and performance tests, under a variety of conditions, of a relatively large number of batteries (or cells) made in various configurations from a variety of materials and/or by different procedures. It is thus essential to efficient implementation of such a development program to be able to test a relatively large number of batteries (or cells) at the same time. Since internal resistance and open circuit voltage are key test parameters which must be checked at relatively frequent intervals, this in turn requires a capability for making (and recording the results of) numerous voltage and current measurements in an efficient manner.

The conventional method of determining the internal resistance of an operating battery is to measure the battery voltage and current while the circuit is closed and then to open the circuit and remeasure the battery ("open circuit") voltage. (The resistance is equal to the difference between the two voltages, divided by the current). This method requires interruption of the circuit, which is generally undesirable, even if the interruption is only for a relatively brief time. It is particularly undesirable when the battery (or cell) involved is undergoing testing, because (1) the battery operation is upset each time the circuit is opened, (2) a stable open circuit voltage cannot be obtained until sufficient relaxation time (after the circuit is broken) has elapsed, and (3) repeated interruption of the circuit requires heavier duty, more expensive load-breaking equipment. The latter drawbacks of the conventional procedure are sharply accentuated when the battery involved is one of a number of batteries being tested simultaneously.

OBJECTS OF THE INVENTION

The primary object of the present invention is to provide a method of open circuit voltage determination which avoids having to interrupt the circuit.

An additional object is to provide a method by which the open circuit voltage of an operating battery (or cell) can be determined very rapidly and without substantially disturbing the operating conditions in the battery.

A further object is to provide a method of determining the internal resistance and/or open circuit voltage of an operating battery (or cell) which is particularly adaptable to computerized monitoring of and data acquisition from a plurality of such batteries being operated under test conditions.

Still other objects will be made apparent to those skilled in the art by the following disclosure.

SUMMARY OF THE INVENTION

The invention, in its broadest aspect, is the method of determining the open circuit voltage of an operating battery or battery cell which comprises measuring the voltage across the battery or cell and the current through it, at two different current levels, and calculating the open circuit voltage from the two sets of voltage and current values so obtained.

More precisely, the method of the invention comprises:

(1) measuring the battery current ($I_1$) and voltage ($E_1$) under a given load, (2) altering said load by a fractional amount and remeasuring the battery or cell current ($I_2$) and voltage ($E_2$) under the altered load, (3) calculating the open circuit voltage ($E_{oc}$) of the battery or cell from the relationship $$E_{oc} = E_1 + (\Delta E / \Delta I) I_1$$

where $\Delta E$ is the absolute difference between $E_1$ and $E_2$ and $\Delta I$ is the absolute difference between $I_1$ and $I_2$, the algebraic sign $I_1$ being negative when the battery is on charge and positive on discharge. (Since the internal resistance of the battery or cell is equal to $\Delta E / \Delta I$, the value of this resistance will also be determined in carrying out the calculation of $E_{oc}$.)

SUMMARY DESCRIPTION OF THE DRAWINGS

FIG. 1 is a diagram for a circuit in which a battery can be tested by operating it in either of two parallel circuit legs, one of which contains a D.C. source for recharging. The circuit is adapted for practice of the present invention by including auxiliary resistances and switching means for altering the resistance in whichever leg the battery is connected to.

DETAILED DESCRIPTION OF THE INVENTION

Figure 1:
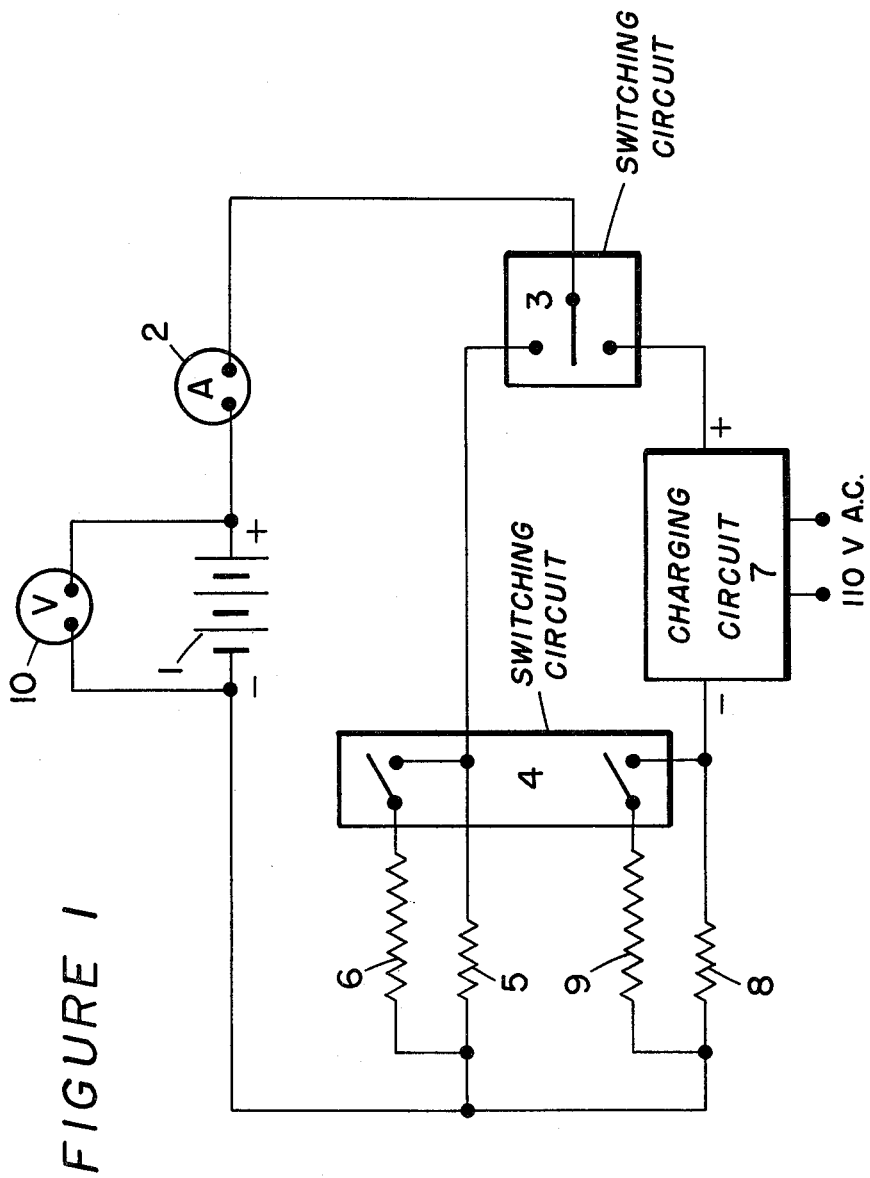

All of the circuit elements and instruments employed in the practice of the invention are of well known types and are generally to be found in conventional battery testing systems.

Referring now to FIG. 1, which is to be regarded as illustrative, not limiting, a test battery (1) is connected in series with an ammeter (2) and a switching circuit (3), the latter being connected to a discharge leg and a charging leg. The dischage leg comprises a side-connection to a second switching circuit (4), an in-line resistance (5) and a side-connection to an auxiliary resistor (6). The charging led comprises in-line connections to a charging circuit, (7), a side-connection to switching means (4), an in-line resistance (8) and side-connections to switching circuit (4) and an auxiliary resistor (9). A voltmeter (10) is connected across the battery (1).

Switching circuit (3) is adapted to hold the circuit through the battery open—as illustrated in the FIGURE—or to connect it to either of said legs, i.e., to put the battery on charge or discharge. Switching circuit (4) is adapted to connect resistors (6) and (9) in parallel across resistances (5) and (8) respectively, or—as illustrated—to break the latter connections. The charging circuit (7) is adapted to supply D.C. of the polarity shown at an appropriate voltage for charging battery (1) at a pre-selected rate.

Although switching means (4), when actuated, has the effect of lowering the resistance in both the charge and discharge leg, this does not matter, since only one of the two legs is connected to the battery at a time. The size (ohms value) of each auxiliary resistor will generally be large enough, in comparison to the ohms value of the resistance it is coupled with, to ensure that the overall resistance of the "live" leg will not be decreased by more than about 25%. A good ratio of the auxiliary to in-line resistances is 9 to 1, resulting in only a 10% decrease in the overall leg resistances when switching circuit (4) is actuated.

For efficient testing of a number of different batteries, each will be provided with a circuit such as that illustrated in FIG. 1. Of course, the charging circuit (7) may be common to all of the test circuits and by use of appropriate auxiliary switching means (not shown in the drawing) the voltmeter and ammeter may be successively connected to one after the other of the test circuits. Ordinarily a computer will be employed to operate the test circuits and to store the voltage and current values obtained when switching circuit (4) is and is not activated (switching circuit (3) of course will generally be closed through one leg or the other of the test circuits). The same computer may be employed to calculate battery internal resistances and open circuit voltages from the stored values. With a high-speed calculator, a high resolution voltmeter (also employed, across a fixed in-line resistance, as an ammeter) and fast acting relays or solid state switching circuits, the internal resistance and open circuit voltage of an operating battery (or cell) can be determined in a few milliseconds. Thus, even with a large number of batteries simultaneously on test, each battery may be checked at adequately frequent intervals by a single computer.

The Hewlett-Packard Automatic Data Acquisition System 3052-A has been found highly satisfactory for operating a plurality of battery test circuits, and monitoring the battery internal resistances and open circuit voltages in accordance with the present invention.

The practise of the invention is illustrated in the following example.

Example 1

The voltage and current of a 5.0 ampere-hour battery cell were measured under normal operating conditions (on discharge) and found to be 1.94542 volts and 0.7628 amperes. The load resistance was momentarily altered by connecting a 10 ohm auxiliary resistor across the load resistance ($\sim 1$ ohm, including lead wires, contact resistances, etc.). The new voltage and current values were then 1.93659 volts and 0.8182 amperes. The internal resistance and open circuit voltage calculated from the foregoing sets of values were 0.159 ohms and 2.067 volts. The open circuit voltage actually measured as such, after the circuit had been opened long enough for the cell to stabilize, was 2.068 volts.

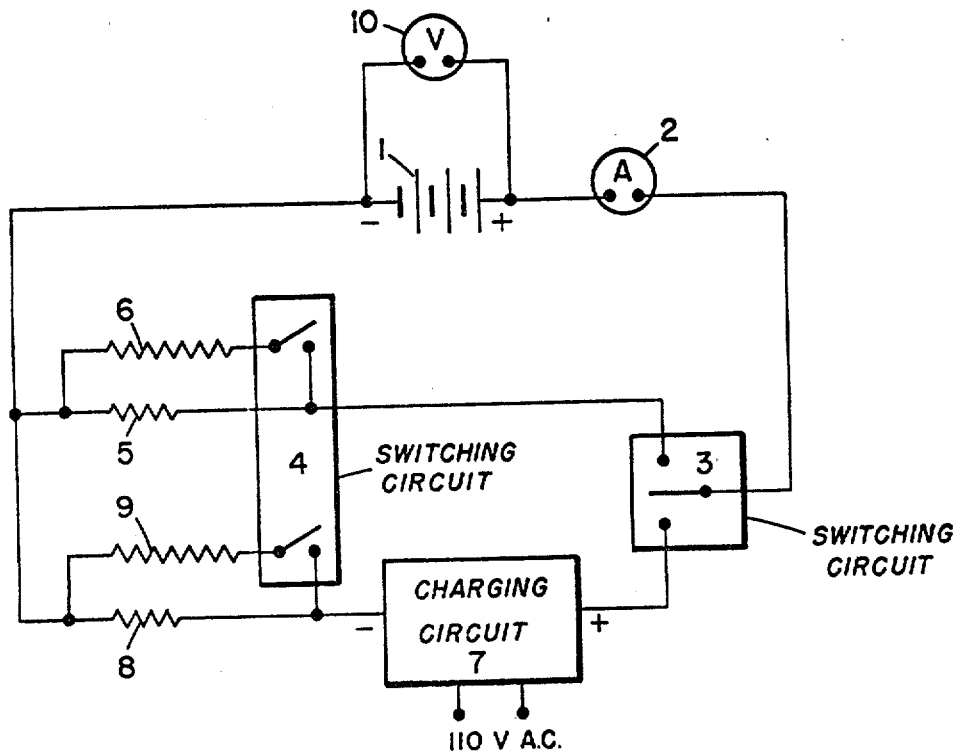

What is claimed is:

1. A method of determining the open circuit voltage of a battery or cell operating in a closed circuit, without interrupting said circuit or substantially destabilizing said battery or cell, said method comprising:
   (1) measuring the battery or cell current ($I_1$) and voltage ($E_1$) under a given load,
   (2) altering said load by a fractional amount and remeasuring the battery or cell current ($I_2$) and voltage ($E_2$) under the altered load, and
   (3) calculating the open circuit voltage ($E_{oc}$) of the battery or cell from the relationship $$E_{oc} = E_1 + (\Delta E / \Delta I) I_1,$$

where $\Delta E$ is the absolute difference between $E_1$ and $E_2$ and $\Delta I$ is the absolute difference between $I_1$ and $I_2$, the algebraic sign of $I_1$ being negative when the battery or cell is on charge and positive on discharge.

2. The method of claim 1 in which said load alteration is effected by connecting a resistor in parallel with a known in-line resistance in said circuit, the resistance ratio being such that the overall resistance of the circuit will not thereby be decreased by more than about 25%.

3. The method of claim 2 in which said ratio is at least 9:1.

* * * * *

UNITED STATES PATENT AND TRADEMARK OFFICE
CERTIFICATE OF CORRECTION

PATENT NO. : 4,204,153
DATED : May 20, 1980
INVENTOR(S) : William E. Brown

It is certified that error appears in the above–identified patent and that said Letters Patent are hereby corrected as shown below:

The title page should be deleted to insert the attached title page therefor.

Column 1, line 14, the letter --e-- should be added to the first word in the sentence to complete the word "batteries";

Column 2, line 18, insert --of-- after "sign";

line 43, "discharge" misspelled;

line 46, "led" should be --leg--;

line 47, comma after "circuit" should be deleted;

line 67, "comparison" misspelled.

Signed and Sealed this

Twenty-eighth Day of October 1980

[SEAL]

Attest:

SIDNEY A. DIAMOND

Attesting Officer

Commissioner of Patents and Trademarks

United States Patent [19]
Brown

[11] 4,204,153
[45] May 20, 1980

[54] METHOD OF DETERMINING THE OPEN CIRCUIT VOLTAGE OF A BATTERY IN A CLOSED CIRCUIT

[75] Inventor: William E. Brown, Walnut Creek, Calif.

[73] Assignee: The Dow Chemical Company, Midland, Mich.

[21] Appl. No.: 939,157

[22] Filed: Sep. 1, 1978

[51] Int. Cl.² ............................................. G01N 27/42
[52] U.S. Cl. ...................................... 324/429; 320/48
[58] Field of Search ........................ 320/48; 324/29.5

[56] References Cited

U.S. PATENT DOCUMENTS

| | | | |
|---|---|---|---|
| 2,922,104 | 1/1960 | Godshalk | 324/29.5 |
| 4,044,304 | 8/1977 | Hamaguchi | 324/29.5 |

*Primary Examiner*—M. Tokar
*Attorney, Agent, or Firm*—Ronald G. Brookens

[57] ABSTRACT

The open circuit voltage of a battery which is connected in a closed circuit is determined without breaking the circuit or causing voltage upsets therein. The closed circuit voltage across the battery and the current flowing through it are determined under normal load and then a fractional change is made in the load and the new current and voltage values determined. The open circuit voltage is then calculated, according to known principles, from the two sets of values.

3 Claims, 1 Drawing Figure